United States Patent [19]

Matsuura et al.

[11] E Re. 31,335

[45] Reissued Aug. 2, 1983

[54] SEARCH TUNING SYSTEM FOR TELEVISION RECEIVER

[75] Inventors: Shigeo Matsuura; Eisaku Akutsu; Hiroshi Miyamoto, all of Yokohama, Japan

[73] Assignee: Hitachi, Ltd., Tokyo, Japan

[21] Appl. No.: 396,110

[22] Filed: Jul. 7, 1982

Related U.S. Patent Documents

Reissue of:

[64] Patent No.: 4,211,988
Issued: Jul. 8, 1980
Appl. No.: 946,193
Filed: Sep. 27, 1978

[30] Foreign Application Priority Data

Sep. 30, 1977 [JP] Japan ..... 52-117452

[51] Int. Cl.[3] ..... H03J 7/22

[52] U.S. Cl. ..... 455/164; 334/16; 455/169

[58] Field of Search ..... 334/11, 13, 16; 358/193.1; 455/161, 164, 169

[56] References Cited

U.S. PATENT DOCUMENTS 3,651,411 3/1972 Zlotnick ..... 334/16 X
4,053,838 10/1977 Amaga ..... 455/164

*Primary Examiner*—Paul L. Gensler
*Attorney, Agent, or Firm*—Antonelli, Terry & Wands

[57] ABSTRACT

A search tuning type channel detector system for television receivers. When AFC voltage of a tuner has attained a first predetermined voltage level, frequency sweeping direction for tuning is reversed and stopped thereby to tune the tuner at an optimum tuning frequency. Means are provided to allow the inversion as well as stoppage of the frequency sweeping only when AFC voltage has attained a second predetermined voltage level, thereby to exclude possible erroneous operation due to noise or the like spurious signal components.

11 Claims, 5 Drawing Figures

SEARCH TUNING SYSTEM FOR TELEVISION RECEIVER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a channel selector apparatus suited to be used for an electronic tuner having a search function in a television receiver.

2. Description of the Prior Art

For the channel selector of television receivers, there have been hitherto known and widely used search type channel selectors and preset search type channel selection apparatus. In the former case, tuning voltage applied to the electronic tuner is swept or scanned to [seach] *search* a desired television or TV signal. Upon reception of the TV signal of a desired channel, the sweeping operation is stopped. On the other hand, in the case of the preset search type channel selector, a digital signal is converted into an analog signal for sweeping the tuning voltage applied to the tuner. When the desired signal has been found, *the* optimum tuning point for the reception of the signal is detected, whereupon the supply of the digital signal is interrupted. The channel selection apparatus of the prior art are, however, disadvantageous in that erroneous operations will be often involved particularly when the signal in concern is of a feeble intensity or when unfavorable conditions exist for the signal reception.

More specifically, it is common in the channel selector apparatus that the identity of a desired signal is discriminated by making use of variation in an automatic frequency control or AFC voltage applied to the tuner. For example, referring to FIG. 1 which graphically illustrates *the* variation in AFC voltage in [a] *the* form of *a* so-called S-like curve, the tuning frequency is taken along the abscissa, while the AFC voltage is taken along the ordinate. As the tuning frequency is swept from a low to *a* high frequency with the tuning voltage being correspondingly swept, an abrupt variation or change in the AFC voltage occurs upon reception of *a* signal. That is, the AFC voltage which is at a high level in the quiescent state is lowered remarkably in response to the signal reception. Subsequent increase in the tuning frequency will result in *an* increasing *of* the AFC voltage *once again*. In the hitherto known channel selectors described above, the sweeping direction of the tuning frequency is inverted when the AFC voltage has attained a predetermined voltage $E_0$ at a frequency $f_2$ as indicated by a point P after having passed through a point Q at a frequency of $f_1$, whereby the sweeping of the tuning frequency is made toward a low frequency. Consequently, the AFC voltage goes once below the voltage level $E_0$ and subsequently rises up again. When the AFC voltage has attained in the course of the reversed sweeping the predetermined voltage level $E_0$ at the frequency $f_1$ as indicated by the point Q, the sweeping of the tuning voltage is then stopped. In other words, the frequency $f_1$ at the point Q in the graph of FIG. 1 is selected as the optimum tuning frequency, the reason for which can be explained by the fact that the tuner is capable of receiving the signal in the most stabilized state at the frequency $f_1$ at the point Q. The frequency sweep is carried out slowly after the inversion of the sweeping direction.

Assuming that the behavior of the AFC voltage is digitalized and the level of AFC voltage higher than the reference $E_0$ is represented by logic "1", while the AFC level lower than $E_0$ is represented by logic "0", the corresponding changes in the logic value during the sweeping of the tuning frequency will be such as shown in FIG. 2(a), in which time is scaled along the abscissa. As can be seen from FIG. 2(a), the logic value of the AFC voltage will change over from "1" to "0" at a time point $t_1$ at which the tuning frequency has attained the frequency $f_1$. Subsequentyly, at time $t_2$ corresponding to the frequency $f_2$, the logic level of the AFC voltage will restore to "1". In the course of the inverted sweeping, when the tuning frequency is decreased below the frequency $f_2$ at time $t_3$, the logic level of the AFC voltage will be reset to "0". When the tuning frequency is further decreased until the frequency $f_1$ has been attained again at time $t_4$, the logic level "1" of *the* AFC voltage will be then re-established. At this time, the sweeping operation is stopped.

In conjunction with the above description, it should be noted that the AFC circuit is in general a high impedance circuit and that noise is frequently superposed on the AFC voltage. Accordingly, there will arise such *a* situation that the AFC voltage which has taken the logic "1" level at the time point $t_2$ will undergo variation in respect of the magnitude and hence the logic value due to noise, as illustrated in FIG. 2(b). Under such circumstance, the AFC voltage could not regain the point Q. Nevertheless, the sweeping of the tuning frequency [is] *will be* interrupted at time $t_5$, which means that the correct or optimum tuning can not be established. Of course, the noise components superposed on the AFC voltage may be removed by means of a capacitor. However, connection of such filter capacitor will in turn result in an unacceptably increased time constant, to involve slower variation in the AFC voltage as well as a low sweeping rate.

SUMMARY OF THE INVENTION

Accordingly, an object of the invention is to provide a channel selector apparatus which is essentially immune to erroneous operations and is capable of stopping positively the sweeping operation at the optimum frequency.

In view of the above and other objects which will become apparent as description proceeds, the invention teaches, with a view to suppressing any erroneous operation due to noise components superposed on *the* AFC voltage that a first voltage corresponding to [a] first and [a] fourth frequency values are utilized in combination with a second voltage which corresponding to [a] second and [a] third frequency values and has a magnitude different from that of the first voltage, wherein the optimum tuning frequency is selected at the first frequency value for the first voltage through the detection of *the* AFC voltage, thereby to allow the sweeping of the tuning frequency to be stopped, so far as the sweeping of the tuning frequency is allowed to be stopped also at the third frequency value for the second voltage.

In a preferred embodiment of the invention, although the sweeping direction of the tuning frequency is inverted at the fourth frequency value for the first voltage, it is prerequisite that the sweeping inversion at the second frequency value for the second voltage must be permitted.

DETAILED DESCRIPTION OF THE PREFERRED EMBODIMENTS

Figure 1:
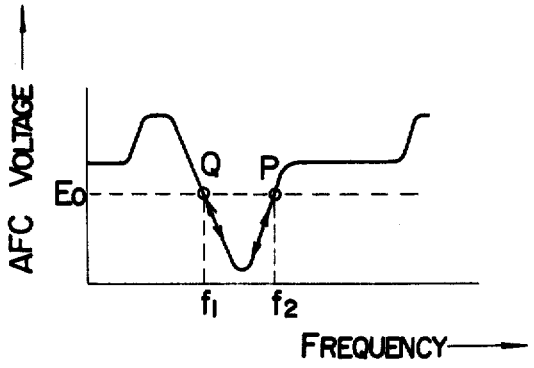
FIG. 1 illustrates graphically *the* relation between *the* AFC voltage and a tuning frequency.
Figure 2:
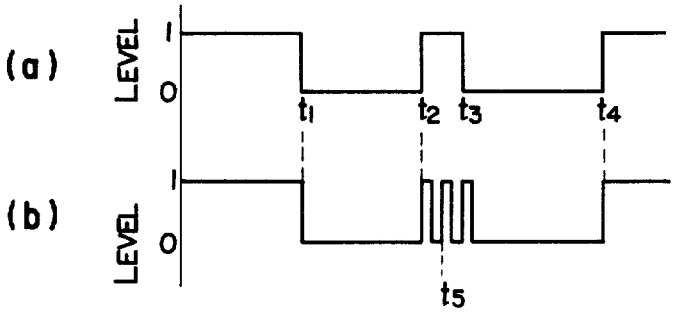
FIG. 2 shows signal-time diagrams to illustrate [behaviors] *the behavior* of *the* AFC voltage in terms of logical values.
Figure 3:
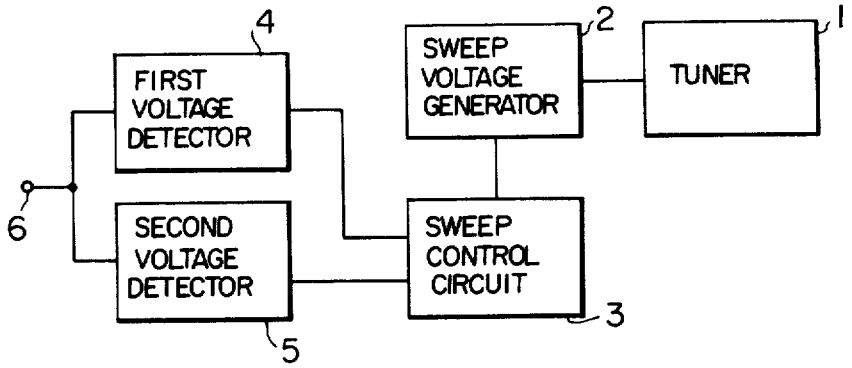
FIG. 3 is a block diagram illustrating a general arrangement of the channel selector apparatus according to an embodiment of the invention.

Referring to FIG. 3 which shows in a block diagram a general arrangement of a channel selector apparatus according to the invention, an electronic tuner 1 is connected to a sweep voltage generator 2 which in turn is connected to a sweep control circuit 3 serving for controlling the sweep voltage generator 2 to effect the sweeping of a tuning voltage in the increasing and decreasing directions as well as the stopping and starting of the sweeping operation. First and second voltage detectors 4 and 5 are connected to the sweep control circuit 3. The first detector 4 serves to detect when the AFC voltage has attained a first preset value, while the second voltage detector 5 serves to detect that the AFC voltage has attained a second predetermined value or level. The AFC voltage is applied at a terminal 6.

As the tuning voltage supplied to the tuner 1 from the sweep voltage generator 2 is increased, the tuning frequency of the electronic tuner 1 is correspondingly increased. In the meantime, when a signal is received, the AFC voltage will undergo variation such as shown at (a) in FIG. 4. So long as the AFC voltage is at a level higher than a threshold level $E_0$, the first voltage detector 4 produces logic "1" output. When AFC voltage is lowered below the voltage level $E_0$, the detector 4 produces logic "0". On the other hand, the output from the second voltage detector 5 is either logic "1" or "0" in dependence on whether the AFC voltage is higher or lower than the threshold voltage $E_1$. The signal waveform output from the first voltage detector 4 is illustrated at (b) in FIG. 4, while that of the second voltage detector 5 is shown at (c) in the same figure. It is to be mentioned that frequency is taken along the abscissa with the output level being taken along the ordinate in all the graphs (a), (b) and (c). According to the teaching of the invention, the preset threshold voltage level of the first voltage detector 4 differs from that of the second voltage detector 5. Thus, the frequency at which the output [siganl] *signal* state from the first voltage detector 4 changes over is different from the frequency at which the output signal state from the second voltage detector 5 is caused to change. Consequently, when the tuning frequency of the electronic tuner 1 is swept from a low frequency to a high frequency, the output signal from the first voltage detector circuit 4 will become logic "0" at a frequency value $f_1$ in the first place and subsequently the output signal from the second voltage detector circuit 5 will be logic "0" at a frequency value $f_3$. When the tuning frequency is further increased and has attained a frequency value $f_4$, the output signal state of the second voltage detector 5 will be restored to logic "1", which is followed by restoration to logic "1" of the output signal from the first voltage detector circuit 4, whereupon the sweeping direction of the tuning frequency is inverted. In other words, the inversion of the sweeping direction is permitted when the output signal from the first voltage detector circuit 4 is restored to logic "1" after the output signal from the second voltage detector circuit 5 has once taken the logic "0" level. At this time, the sweeping is inhibited from being stopped. In this manner, even when the output signal from the first voltage detector circuit 4 alternates repeatedly between the logic levels "1" and "0" due to influence of the superposed noise, the sweeping operation is never interrupted. In the course of the inverted sweeping, when the [timing] *tuning* frequency becomes lower than the value $f_2$, the output signal from the first voltage detector circuit 4 will be changed over to logic "0" state. Further decrease of the tuning frequency below $f_4$ will cause the output signal from the second voltage detector circuit 5 to be changed to logic "0". At the frequence $f_3$ in the course of the inverted sweeping, the output signal from the second voltage detector 5 is restored to logic "1", which is followed by restoration to logic "1" of the output signal from the first voltage detector circuit 4, whereupon the sweeping operation is caused to stop. In other words, the inverted frequency sweeping is caused to stop at the time when the output signal from the first voltage detector circuit 4 is changed to logic "1" after the output signal from the second voltage detector circuit 5 has been restored to the logic "0" state. By selecting the optimum tuning frequency at $f_1$, the electronic tuner can receive the signal of the selected channel in a stabilized manner.

Figure 4:
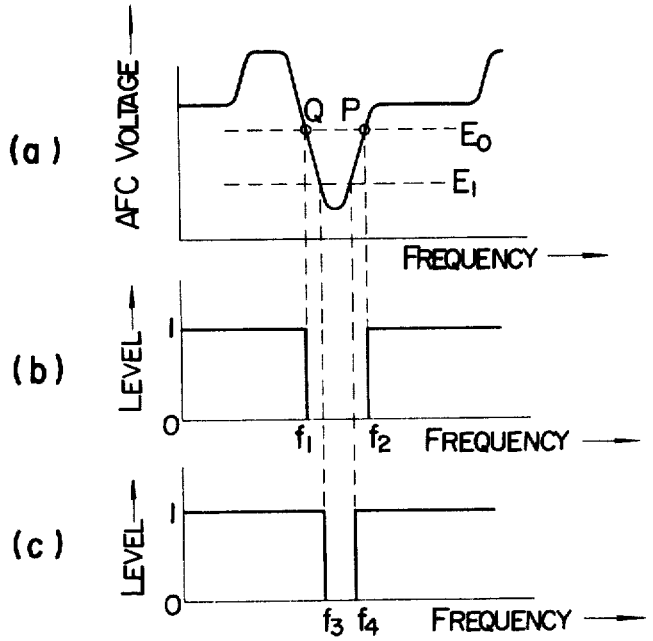
FIG. 4 illustrates graphically [behaviors] *the behavior* of the AFC voltage in terms of digital and analog quantities.
Figure 5:
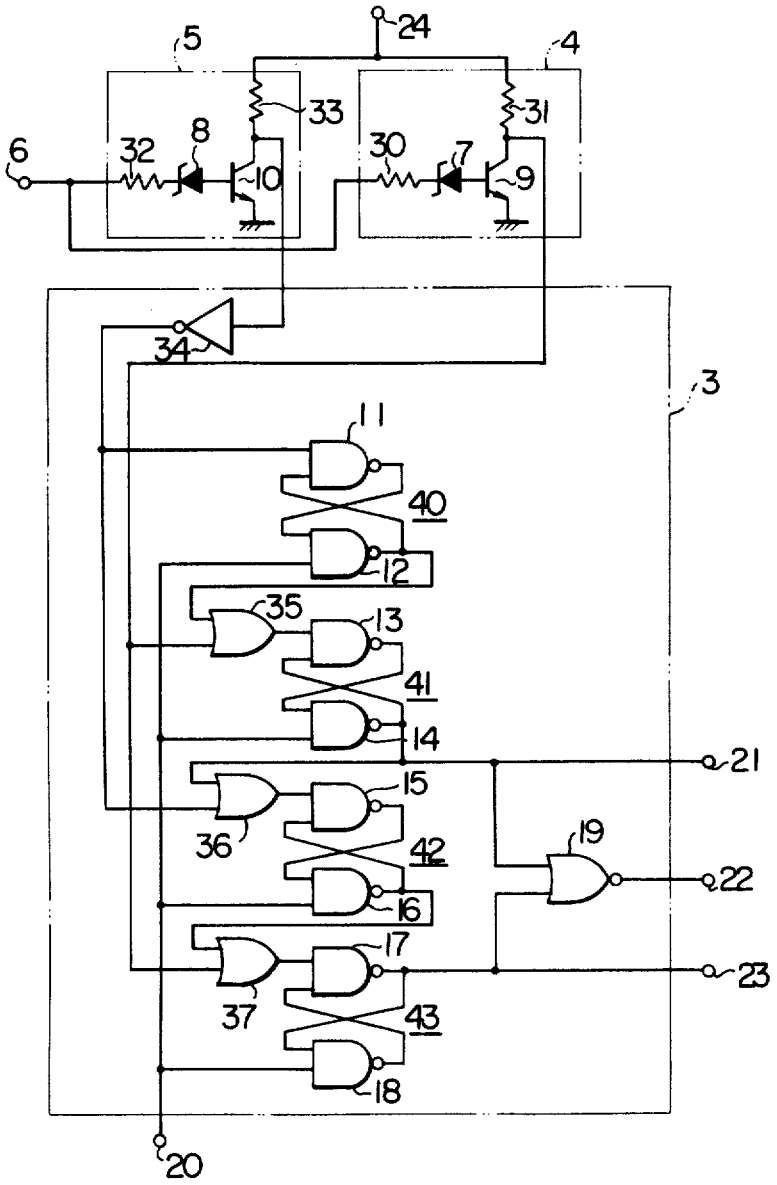
FIG. 5 is a circuit diagram showing a main portion of the channel selector apparatus according to an embodiment of the invention.

FIG. 5 shows *a* typical [embodiments] *embodiment* of *a* circuit [arrangements] *arrangement* for the first and second voltage detector circuits as well as the sweep control circuit described above. The first voltage detector circuit 4 is composed of resistors 30, 31, a Zener diode 7 and a transistor 9, while the second voltage detector circuit 5 is constituted by resistors 32, 33, a Zener diode 8 and a transistor 10. It is to be mentioned that the first and second voltage detectors 4 and 5 shown in FIG. 5 are so implemented that the logical values of the outputs therefrom are complementary to those described above in conjunction with FIG. 4. The sweep control circuit 3 includes NAND gates 11 to 18, OR gates 35 to 37, an NOR gate 19 and an inverter 34. *An* AFC voltage is applied to a terminal [36]*6*, while *a* power source voltage is supplied to a terminal 24. Numeral 20 denotes a reset terminal to which a reset signal is applied from a channel selection button array (not shown), 21 denotes an output terminal for producing an output signal for sweeping the tuning frequency from a low to a high frequency (i.e. in the increasing direction), 22 denotes an output terminal for producing *an* output signal for sweeping the tuning frequency in the decreasing direction, and 23 designates a terminal for producing a signal for stopping the frequency sweeping. It will be noted that pairs of NAND gates 11, 12; 13, 14; 15, 16; and 17, 18 constitute flip-flops 40, 41, 42 and 43, respectively.

Before starting the frequency sweeping, a reset pulse signal varying the logic state thereof from "1" to "0" for signal reception of a certain channel is applied to the reset input terminal 20. In the quiescent state (i.e. in the absence of *an* input signal), the AFC voltage is at a level higher than the first and the second threshold voltages $E_0$ and $E_1$, so that both of the transistors 9 and 10 are in the conductive state. Upon reception of a television signal, the AFC voltage is lowered below the first and the second voltages $E_0$ and $E_1$, whereby the Zener diodes 7 and 8 as well as the transistors 9 and 10 become non-conductive.

Assuming that the transistors 9 and 10 are conductive, the output signals from the the first and second voltage detector circuits 4 and 5 are logic "0's". All of the flip-flops 40 to 43 are reset through the reset pulse signal applied to the NAND gates 12, 14, 16 and 18. Under [the] *this* condition, the output signals from the flip-flops 40, 41 and 42 are logic "1's", while the output from the flip-flop 43 is logic "0". In response to the resetting of the flip-flop 41, the logic "1" signal appears at the terminal 21 to start the frequency sweeping. At that time, the output signals at the terminals 22 and 23 are both logic "0's". When the AFC voltage becomes lower than the first voltage $E_0$ as the tuning frequency is increased, the Zener diode 7 is turned off to make the transistor 9 to be non-conductive. As a result, the output signal from the first voltage detector circuit 4 becomes logic "1". In this case, no change occurs in the operating state of the sweep control circuit 3. Further decreasing of the AFC voltage below the second threshold voltage $E_1$, the transistor 10 is also turned off, resulting in the logic "1" signal output from the second voltage detector circuit 5. This signal is inverted through the inverter 34 and applied to the flip-flop 40, whereby the latter is set. Under [the] *this* condition, the signal supplied to the OR gate 35 from the NAND gate 12 is at the logic "0" level. In the meantime, no variation occurs in the logic values of the output signals at the terminals 21 to 23. The lowering of the AFC voltage below the second threshold voltage $E_1$ is stored by the flip-flop 40 set as described above. When the tuning frequency is further increased, the AFC voltage is again increased to turn on the transistor 10 again, whereby the output signal from the second voltage detector circuit 5 becomes logic "0". During this period, the operation of the sweep control circuit 3 undergoes no variation. Further increase of AFC voltage brings about the turning-on of the transistor 9, which is turn results in the logic "0" signal output from the first voltage detector circuit once again. Then, both inputs to the OR gate 35 become logic "0's" and thus the flip-flop 41 is set. The signal supplied to the OR gate 36 and the terminal 21 from NAND gate 14 becomes logic "0". Since the output voltage at the terminal 23 is then also logic "0", the output signal from the terminal 22 is logic "1", whereby the sweeping direction is inverted. In the inverted sweeping, the AFC voltage is initially decreased to a level below the second voltage $E_1$, as a result of which the transmitter 10 is turned off and thus the output signal from the second voltage detector circuit 5 becomes logic "1". This output signal is inverted by the inverter 34 and applied to the OR gate 36. Thus, the two inputs to OR gate 36 are both logic "0's" thereby to set the flip-flop 42. The signal transferred from the NAND gate 16 to OR gate 37 is then logic "0". The output from the inverter 34 is also supplied to the flip-flop 40, the state of which remains however unchanged. The lowering of the AFC voltage below the second threshold voltage $E_1$ at the second time is stored or memorized by the flip-flop 42. When the AFC voltage is once again increased in the inverted sweeping phase, thereby to turn on the transistors 10 and 9 sequentially, the output voltage from the first voltage detector circuit 4 will become logic "0". Consequently, the logic "0" output from the OR gate 37 will set the flip-flop 43. The signal supplied to the terminal 23 from the NAND gate 17 thus becomes logic "1" and brings about the stoppage of the frequency sweeping.

For [serching] *searching for* another channel, *a* pulse signal having *a* logic level varying from logic "0" to "1" in this order is applied to the input terminal 20. Upon application of the logic "0" signal at the terminal 20, the flip-flops 40 to 43 are reset and thus the output signal at the terminal 21 becomes logic "1". So long as the signal supplied to the terminal 20 is held at logic "0" level, the output signals at the terminals 22 and 23 are maintained at logic "0" level, whereby the sweeping can be continued without inversion or interruption. When the state is attained for receiving the signal of a desired channel, the signal supplied to the terminal 20 is changed over to the logic "1" level and the selection of the optimum tuning frequency for the selected channel can be accomplished in the manner described above.

The sweep voltage generator used in the channel selector apparatus according to the invention may be composed of any conventional sweep voltage generator such as a digital-to-analog converter or the one in which charging and discharging of a capacitor is made use of.

In the case where the S-like curve such as shown in FIG. 4, (a) is upset, the voltage $E_1$ may be selected higher than the voltage $E_0$.

From the foregoing description, it will be appreciated that the channel selector apparatus according to the invention is essentially immune to erroneous operation due to *a* noise component superposed on the AFC voltage and assures that the tuner can receive the TV signal at *a* selected channel in a [much] stabilized state at the optimum tuning frequency. Further, because a filtering capacitor need not be connected to the input terminal for *the* AFC voltage, the frequency sweeping rate can be enhanced.

We claim:

1. A search tuning system for a television receiver comprising:

a tuner having frequency *which is* increased monotonously in response to application of a tuning voltage of a magnitude [increased] *which is changed* monotonously in one direction and adapted to produce a first AFC voltage at a first frequency and a fourth frequency higher than said first frequency upon reception of a television signal, said first AFC voltage being different from an AFC voltage in the quiescent state, said tuner being further adapted to produce a second AFC voltage at a second frequency higher than said first frequency as well as at a third frequency which is higher than said second frequency and lower than said fourth frequency;

a sweep voltage generator circuit for supplying said tuning voltage to said tuner;

a sweep control circuit for supplying a control signal to said sweep voltage generator circuit thereby to control increasing, decreasing and holding of said tuning voltage;

a first voltage detector circuit for detecting when the AFC voltage of said tuner has attained said first voltage thereby to produce a first detection signal to be supplied to said sweep control circuit;

wherein said sweep voltage generator circuit is controlled by said sweep control circuit unless said first detector circuit produces said first detection signal, whereby said tuning voltage applied to said tuner is caused to vary in said one direction thereby to sweep said tuning frequency, while upon reception of a television signal during said frequency sweeping, the sweeping of said tuning voltage is inverted in response to generation of said first detection signal from said first detector circuit, wherein said sweep control circuit responds to disappearance of said first detection signal in the course of said inverted sweeping thereby to hold the instantaneous tuning voltage and stop the sweeping of said tuning frequency;

said search tuning system further including a second voltage detector circuit for producing a second detection signal when *the* AFC voltage of said tuner has attained said second AFC voltage and supplying said second detection signal to said sweep control circuit, wherein, upon detection of said second detection signal through said second detector circuit in the course of said frequency sweeping in said one direction, said second detection signal is applied to said sweep control circuit which then controls said sweep voltage generator circuit [thereby to invert] *such that* the frequency sweeping direction *is allowed to be inverted* and [hold the corresponding tuning voltage invariably] *the inverted sweeping is continued* until application of said second detection signal, while upon production of said second detection signal from said second voltage detector circuit said second detection signal is supplied to said sweep control circuit to be stored therein for preparation of stopping said inverted frequency sweeping, which is then realized by holding invariably said tuning voltage from said sweep voltage generator circuit in response to application of said first detection signal produced from said first detection circuit when the AFC voltage has attained said first AFC voltage at said first frequency.

2. A search tuning system for a television receiver comprising:

a tuner having a tuning frequency increased monotonously in response to application of a tuning voltage of a magnitude [increased] *which is changed* monotonously in one direction and adapted to produce a first AFC voltage at a first frequency and a fourth frequency higher than said first frequency upon reception of a television signal, said first AFC voltage being different from an AFC voltage in the quiescent state, said tuner being further adapted to produce a second AFC voltage at a second frequency higher than said first frequency as well as at a third frequency which is higher than said second frequency and lower than said fourth frequency;

a sweep voltage generator circuit for supplying said tuning voltage to said tuner;

a sweep control circuit for supplying a control signal to said sweep voltage generator circuit thereby to control increasing, decreasing and clamping of said tuning voltage;

a first voltage detector circuit for detecting when the AFC voltage of said tuner has attained said first voltage thereby to produce a first detection signal to be supplied to said sweep control circuit;

wherein said sweep voltage generator circuit is controlled by said sweep control circuit unless said first detector circuit produces said first detection signal, whereby said tuning voltage applied to said tuner is caused to vary in said one direction thereby to sweep said tuning frequency, while upon reception of a television signal during said frequency sweeping, the sweeping of said tuning voltage is inverted in response to disappearance of said first detection signal from said first detector circuit upon increasing of the AFC voltage of said tuner beyond said first AFC voltage at said fourth frequency in succession to generation of said first detection signal by said first detector circuit, wherein said sweep control circuit responds to disappearance of said first detection signal in succession to generation thereof in the course of said inverted sweeping thereby to hold the instantaneous tuning voltage and stop the sweeping of said tuning frequency;

said search tuning system further including a second voltage detector circuit for producing a second detection signal when AFC voltage of said tuner becomes lower than said second AFC voltage and supplying said second detection signal to said sweep control circuit, wherein, when the AFC voltage has attained said second voltage at said second or third frequency, said second voltage detector produces said second detection signal which is then applied to said sweep control circuit which in turn controls said sweep voltage generator circuit [thereby to invert] *such that* the frequency sweeping direction *is allowed to be inverted* and [hold the corresponding tuning voltage invariably] *the inverted sweeping is continued* until application of a further second detection signal from said second voltage detector circuit, while upon production of said second detection signal from said second voltage detector circuit said second detection signal is supplied to said sweep control circuit to be stored therein for preparation of stopping said inverted frequency sweeping, which is then realized by holding invariably said tuning voltage from said sweep voltage generator circuit in response to application of said first detection signal produced from said first detection circuit when the AFC voltage has attained said first AFC voltage at said first frequency.

3. A search tuning system for a television receiver comprising:

a tuner having a tuning frequency increased monotonously in response to application of a tuning voltage of a magnitude [increased] *which is changed* monotonously in one direction and adapted to produce a first AFC voltage at a first frequency and a fourth frequency higher than said first frequency upon reception of a television signal, said first AFC voltage being different from an AFC voltage in the quiescent state, said tuner being further adapted to produce a second AFC voltage at a second frequency higher than said first frequency as well as at a third frequency which is higher than said second frequency and lower than said fourth frequency;

a sweep voltage generator circuit for supplying said tuning voltage to said tuner;

a sweep control circuit for supplying a control signal to said sweep voltage generator circuit thereby to control increasing, decreasing and holding of said tuning voltage;

a first voltage detector circuit for detecting when the AFC voltage of said tuner has attained said first voltage thereby to produce a first detection signal to be supplied to said sweep control circuit;

wherein said sweep voltage generator circuit is controlled by said sweep control circuit unless said first detector circuit produces said first detection signal, whereby said tuning voltage applied to said tuner is caused to vary in said one direction thereby to sweep said tuning frequency, while upon reception of a television signal during said frequency sweeping, the sweeping of said tuning voltage is inverted in response to disappearance of said first detection signal from said first detector circuit upon increasing of AFC voltage of said tuner beyond said first AFC voltage at said fourth frequency in succession to generation of said first detection signal by said first detector circuit, wherein said sweep control circuit responds to disappearance of said first detection signal in succession to generation thereof in the course of said inverted sweeping thereby to hold the instantaneous tuning voltage and stop the sweeping of said tuning frequency;

said search tuning system further including a second voltage detector circuit for producing a second detection signal when the AFC voltage of said tuner becomes lower than said second AFC voltage and supplying said second detection signal to said sweep control circuit, wherein said sweep control circuit is adapted to control said sweep voltage generator circuit so as to effect the frequency sweeping continuously in said one direction until application of said second detection signal from said second detection circuit, while upon detection of the AFC voltage having attained said second voltage at said second frequency, said second detector circuit supplies said second detection signal to said sweep control circuit to be stored therein for preparation of inversion of the frequency sweeping direction, which is then realized by said sweep voltage generator circuit in response to application of said first detection signal produced from said first detection circuit when the AFC voltage has attained said first voltage at said fourth frequency, wherein, upon detection of said second detection signal through said second detector circuit at said third frequency, said second detection signal is applied to said sweep control circuit which then controls said sweep voltage generator circuit [thereby to invert] *such that* the frequency sweeping direction *is allowed to be inverted* and [hold the corresponding tuning voltage invariably] *the inverted sweeping is continued* until application of said second detection signal from said second voltage detector circuit, while upon production of said second detection signal from said second voltage detector circuit said second detection signal is supplied to said sweep control circuit to be stored therein for preparation of stopping said inverted frequency sweeping, which is then realized by holding invariably said tuning voltage from said sweep voltage generator circuit in response to application of said first detection signal produced from said first detection circuit when the AFC voltage has attained said first AFC voltage at said first frequency.

*4. For use in a television receiver including a tuner having a tuning frequency which varies in proportion to the magnitude of an applied tuning voltage, and which produces an AFC signal of a first voltage level both at a first tuning frequency and a fourth tuning frequency higher than said first tuning frequency upon reception of a television signal and produces an AFC signal of a second voltage level at a second tuning frequency higher than said first tuning frequency as well as at a third tuning frequency which is higher than said second tuning frequency and lower than said fourth tuning frequency, a search tuning system comprising:*

*sweep voltage generator means for selectively applying to said tuner a tuning voltage of continuously-changing magnitude in one direction, continuously-changing magnitude in the direction opposite said one direction or a constant magnitude in response to receipt of first, second or third control signals, respectively;*

*first voltage detector means responsive to said AFC signal for producing a first detection signal when said AFC signal is at said first voltage level;*

*second voltage detector means responsive to said AFC signal for producing a second detection signal when said AFC signal is at said second voltage level; and*

*sweep control means responsive to said first and second voltage detector means for controlling said sweep voltage generator means to generate said first control signal until said first detection signal is generated subsequent to generation of said second detection signal, to generate said second control signal upon generation of said first detection signal subsequent to generation of said second detection signal and said first control signal, and to generate said third control signal upon generation of said first detection signal subsequent to generation of said second detection signal and said second control signal.*

*5. A search tuning system as defined in claim 4, wherein said sweep control means includes first means responsive to the output of said second voltage detector means for producing an output upon receipt of said second detection signal and second means normally producing said first control signal and responsive to said first detector means and the output produced by said first means for ceasing to produce said first control signal.*

*6. A search tuning system as defined in claim 5, wherein said sweep control means further includes third means responsive to the output of said second detector means and the lack of production of said first control signal by said second means for producing an output, and fourth means responsive to the output of said first detector means and the output of said third means for producing said third control signal.*

*7. A search tuning system as defined in claim 6, wherein said sweep control means further includes gate means for producing said second control signal in response to the logical sum of the outputs of said second and fourth means.*

*8. A search tuning system as defined in claims 6 or 7, wherein said first, second, third and fourth means include bistable devices.*

*9. A search tuning system as defined in claim 4, wherein said sweep control means includes means for storing the receipt of successive ones of said first and second detection signals and means responsive to said storing means for producing said first, second and third control signals.*

*10. A search tuning system as defined in claim 9, wherein said storing means includes a plurality of bistable devices connected in cascade.*

*11. A search tuning system for a television receiver comprising:*

*a tuner having a tuning frequency increased monotonously in response to application of a tuning voltage of a magnitude changed monotonously in one direction and adapted to produce an AFC voltage signal assuming a first AFC voltage at a first frequency and a fourth frequency higher than said first frequency upon reception of a television signal, said AFC signal assuming a second AFC voltage at a second frequency higher than said first frequency as well as at a third frequency which is higher than said second frequency and lower than said fourth frequency; a sweep voltage generator circuit for supplying said tuning voltage to said tuner; a sweep control circuit for supplying a control signal to said sweep voltage generator circuit thereby to control increasing, decreasing and clamping of said tuning voltage; and a first voltage detector circuit for detecting the fact that the AFC voltage signal from said tuner has attained said first voltage thereby to produce a first detection signal to be supplied to said sweep control circuit; wherein said sweep voltage generator circuit is controlled by said sweep control circuit such that the sweeping of said tuning voltage is inverted in response to said first detection signal from said first detector circuit as said AFC voltage signal passes beyond said first AFC voltage at said fourth frequency, the inverted sweeping of said tuning voltage is stopped in response to said first detection signal from said first detector circuit as said AFC voltage signal passes beyond said first AFC voltage at said first frequency, and said tuning voltage is held in a state of said first AFC voltage at said first frequency;*

*(a) said search tuning system further comprises a second detector circuit for detecting the fact that the AFC voltage signal from said tuner has attained said second voltage thereby to produce a second detection signal to be supplied to said sweep control circuit; and*

*(b) said sweep control circuit includes:*

*means for inhibiting inversion of the tuning voltage sweeping direction until after generation of said second detection signal by said second voltage detector circuit at said second frequency and for detecting and storing said second detection signal when it is generated thereby making preparations for inversion of the tuning voltage sweeping direction, and*

*means for inhibiting, after the inversion of the tuning voltage sweeping direction at said fourth frequency, stoppage of the tuning voltage sweeping in the inverted direction until after regeneration of said second detection signal by said second voltage detector circuit at said third frequency and for detecting and storing said second detection signal when it is regenerated thereby making preparations for the stoppage of the tuning voltage sweeping.*

* * * * *